United States Patent
Thiele et al.

(10) Patent No.: US 7,659,754 B2
(45) Date of Patent: Feb. 9, 2010

(54) CMOS POWER SWITCHING CIRCUIT USABLE IN DC-DC CONVERTER

(75) Inventors: Gerhard Thiele, Munich (DE); Erich Bayer, Thonhausen (DE)

(73) Assignee: Texas Instruments Deutschland GmbH, Freising (DE)

(*) Notice: Subject to any disclaimer, the term of this patent is extended or adjusted under 35 U.S.C. 154(b) by 99 days.

(21) Appl. No.: 11/939,439

(22) Filed: Nov. 13, 2007

(65) Prior Publication Data
US 2008/0111611 A1    May 15, 2008

(30) Foreign Application Priority Data
Nov. 13, 2006   (DE) ................ 10 2006 053 321

(51) Int. Cl.
*H03B 1/00* (2006.01)
*H03K 3/00* (2006.01)

(52) U.S. Cl. .............. 327/108; 327/112; 327/376; 327/377; 327/387; 327/389; 327/391; 327/434; 327/435; 327/436; 327/437; 326/85; 326/86; 326/87; 326/90; 326/91; 323/284

(58) Field of Classification Search ........... 327/108, 327/112, 434–436
See application file for complete search history.

(56) References Cited

U.S. PATENT DOCUMENTS

| | | | |
|---|---|---|---|
| 6,538,479 B2* | 3/2003 | Bellomo et al. ............ | 327/108 |
| 6,836,173 B1* | 12/2004 | Yang ............................ | 327/390 |
| 6,975,146 B1* | 12/2005 | Schottler .................... | 327/108 |
| 7,135,894 B1* | 11/2006 | Stegers et al. .............. | 327/108 |
| 2003/0107425 A1* | 6/2003 | Yushan ....................... | 327/333 |

FOREIGN PATENT DOCUMENTS

| | | |
|---|---|---|
| DE | 102 46 083 | 3/2004 |
| WO | WO 2004/032323 | 4/2004 |

\* cited by examiner

*Primary Examiner*—Lincoln Donovan
*Assistant Examiner*—John W Poos
(74) *Attorney, Agent, or Firm*—John J. Patti; Wade J. Brady, III; Frederick J. Telecky, Jr.

(57) ABSTRACT

A power switching circuit in CMOS technology has a power MOS transistor and a driver stage. The power MOS transistor is operated at a higher supply voltage in excess of its maximum allowable gate-source voltage; and the driver stage of the level shifter is operated at a lower supply voltage substantially lower than the supply voltage for the power MOS transistor. The driver stage includes a pair of driver MOS transistors coupled in series between a higher supply voltage rail and a reference potential rail, and at an interconnection node coupled to the gate of the power MOS transistor. The gates of the driver MOS transistors are AC-coupled to drive signals of mutually opposite phase; and the gates of the driver MOS transistors are each connected to the higher voltage supply rail through a respective parallel connection of a first resistor and a second resistor connected in series with a non-linear component. The resistance value of the second resistor is substantially smaller than the resistance value of the first resistor.

10 Claims, 2 Drawing Sheets

US 7,659,754 B2

CMOS POWER SWITCHING CIRCUIT USABLE IN DC-DC CONVERTER

This application claims priority from German Patent Application No. 10 2006 053 321.6 filed 13 Nov. 2006.

FIELD OF THE INVENTION

The invention relates to a power switching circuit implemented in CMOS technology and particularly adapted for use in a DC-DC converter.

BACKGROUND

A DC-DC boost converter, such as for use, for example, in a power supply for LCD panels, typically has a power MOS transistor driven by a driver stage implemented in CMOS technology. The power MOS transistor is preferably also implemented in CMOS technology with the same integrated circuit and thus on the same chip. Accordingly, voltage limitations of the CMOS circuit likewise apply to the power CMOS transistor. The critical voltage is, of course, the admissible gate-source voltage. For a required output voltage of the converter, it is often necessary to operate the power MOS transistor at a supply voltage quite in excess of the maximum admissible gate-source voltage of the integrated power MOS transistor. Therefore, it is necessary to use a level shifter in the driver stage to move the gate-source voltage of the power MOS transistor to the right level.

Conventional solutions for such a level shifter require the use of large high voltage driver transistors. To protect the level shifter, a Zener diode is necessary. Both requirements add to the size and cost of the integrated circuit. In addition, since the value of the Zener diode voltage is equal to the minimum output voltage of the level shifter, such minimum value cannot arbitrarily be adjusted to the requirements of a particular application.

SUMMARY

The invention provides a power switching circuit in CMOS technology with a power MOS transistor and a driver stage adapted to be implemented in simple circuitry, without special components such as a Zener diode and large high voltage drive transistors, yet achieving fast switching and increased efficiency.

In particular, the invention provides a power switching circuit in CMOS technology, comprising a power MOS transistor and a driver stage. The power MOS transistor is operated at a higher supply voltage in excess of its maximum allowable gate-source voltage and the driver stage is operated at a lower supply voltage, i.e., the main supply voltage of the integrated circuit incorporating both of the driver circuit and the power MOS transistor (as well as other circuit components).

The main supply voltage to the integrated circuit is substantially lower than the supply voltage for the power MOS transistor. The driver stage includes a pair of driver MOS transistors connected in series between the higher supply voltage rail and the reference potential rail for both supply voltages.

In described embodiments, the gate of the power MOS transistor is connected to the interconnection node between both driver MOS transistors. The gates of the driver MOS transistors are AC-coupled to drive signals of mutually opposite phase, usually derived from a clock signal. The gates of the driver MOS transistors are each connected to the higher voltage supply rail through a parallel connection of a first resistor on the one hand, and through a second resistor connected in series with a non-linear component on the other hand. The resistance value of the second resistor is substantially smaller than the resistance value of the first resistor. The non-linear component connected in series with a relatively small resistor acts effectively as a non-linear resistor in combination with the relatively large parallel-connected resistor to reduce the gate voltage at the corresponding driver MOS transistor. By an asymmetrical level-shift at the gates of each driver MOS transistor, the required level-shifting at the gate of the power MOS transistor is achieved. The non-linear component can be a diode, a diode-connected bipolar transistor or a MOS transistor.

BRIEF DESCRIPTION OF THE DRAWINGS

The new architecture and the benefits of the invention will be apparent from the following description of embodiments of the inventive power switching circuit with reference to the accompanying drawings, wherein.

DETAILED DESCRIPTION OF EXAMPLE EMBODIMENTS

Figure 1:
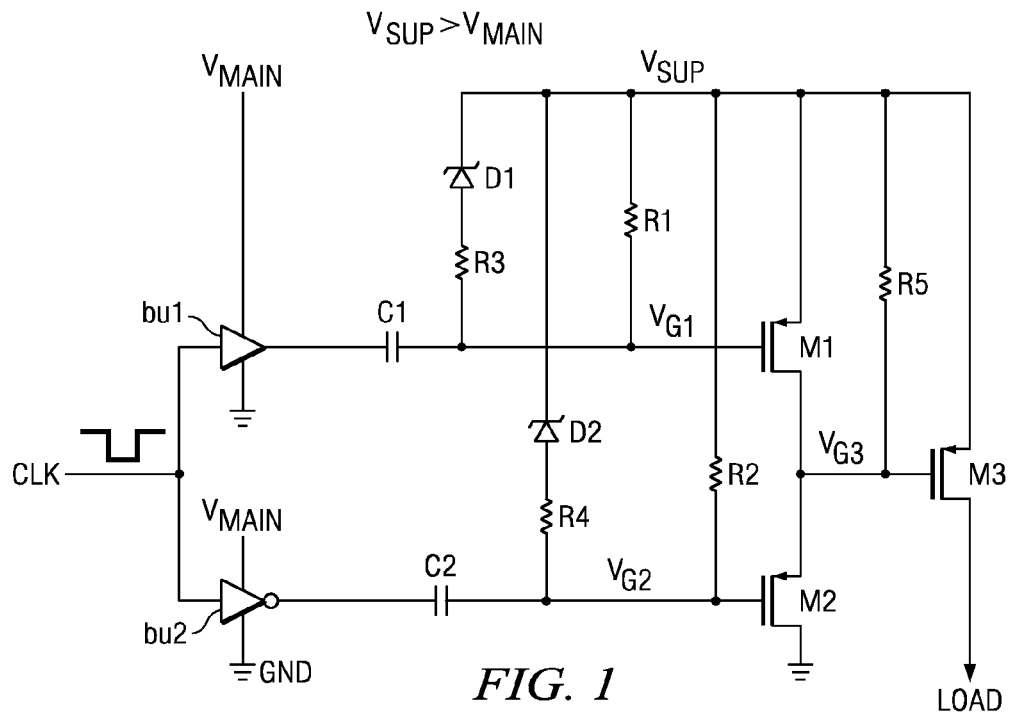
FIG. 1 is a circuit diagram of a power switching circuit in accordance with principles of the invention.

The circuitry in FIG. 1 is typically contained in a DC-DC converter chip implemented in CMOS technology. An input clock signal CLK is applied in parallel to the inputs of two buffers bu1, bu2. In the example shown, buffer bu1 is assumed to be non-inverting and buffer bu2 to be inverting. Of course, a non-inverting buffer is usually achieved in CMOS technology by series-connecting two inverting buffer stages. Both buffer stages bu1, bu2 are supplied from a main supply voltage rail at a relatively low voltage $V_{MAIN}$, referenced to ground GND. The outputs of buffers bu1, bu2 are coupled to downstream circuitry through capacitors C1, C2, respectively. Two PMOS transistors M1, M2 are connected in series between a supply voltage rail at a relatively high voltage $V_{SUP}$ and ground. The gate of transistor M1 is coupled to the output of buffer bu1 through capacitor C1, and the gate of transistor M2 is coupled to the output of buffer bu2 through capacitor C2. In the embodiment shown, the supply voltages $V_{MAIN}$ and $V_{SUP}$ are positive with respect to ground, transistor M1 has its source connected to the supply voltage $V_{SUP}$, and transistor M2 has its drain connected to ground. The interconnection node of transistors M1, M2 provides a voltage $V_{G3}$ and is connected to the gate of a power PMOS transistor M3, which has its source connected to the supply rail voltage $V_{SUP}$ and its drain connected to a load (not shown).

To ensure that transistor M3 remains OFF when the clock signal CLK is inactive (not present or interrupted), the gate of transistor M3 is connected to supply rail $V_{SUP}$ through a resistor R5.

Transistor M1 has a gate bias provided by connecting a resistor R1 between its gate and supply rail $V_{SUP}$, in parallel with a series connection of a non-linear component such as a diode D1 and a resistor R3. Likewise. Transistor M2 has a gate bias provided by connecting a resistor R2 between its gate and supply rail $V_{SUP}$, in parallel with a series connection of a diode D2 and a resistor R4.

As already mentioned, the maximum admissible gate-source voltage $V_{GS\_max\_M3}$ of transistor M3 is lower than the higher supply voltage $V_{SUP}$. Thus, the power transistor M3 needs to be driven by driver circuitry supplied from the lower supply voltage $V_{MAIN}$. The driver PMOS transistor M1 switches power transistor M3 OFF and the driver, source-follower connected PMOS transistor M2 switches transistor M3 ON. In the DC condition (no clock signal CLK applied), the gates of transistors M1, M2 and M3 are all pulled up to $V_{SUP}$ by the respective resistors R1, R2 and R5. With the clock signal CLK applied, transistor M3 toggles between ON and OFF at the frequency of the clock signal.

Figure 1A:
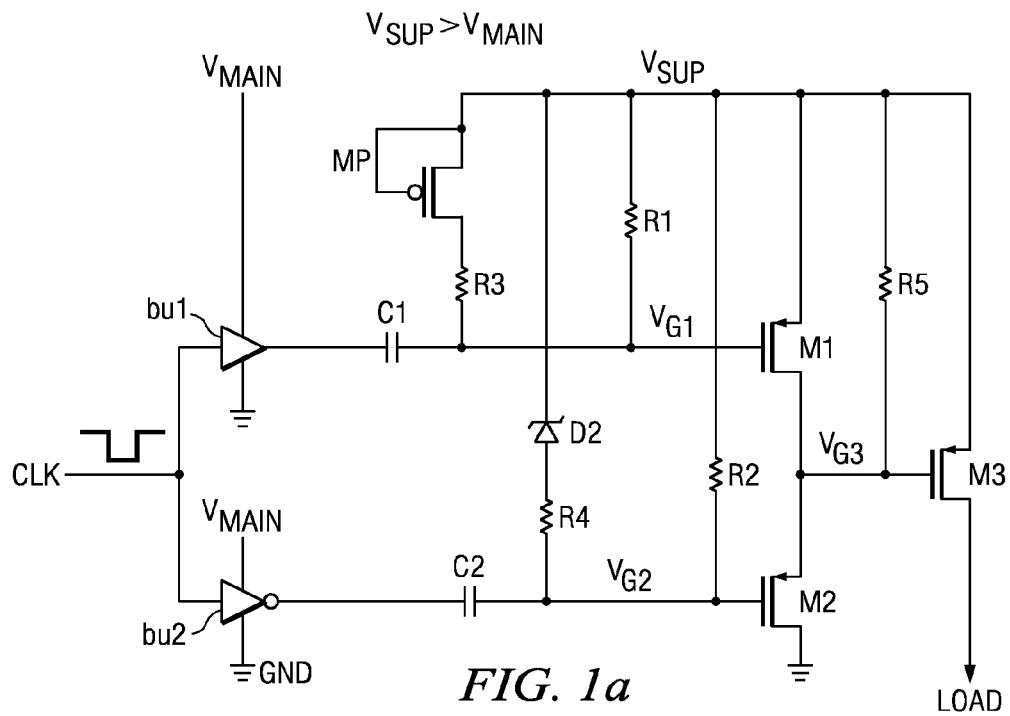
FIG. 1A is a circuit diagram of a modified power switching circuit in accordance with principles of the invention.

In the embodiment of FIG. 1A, the diode D1 has been replaced by a diode-connected p-channel MOS transistor MP, other components and arrangements remaining as shown in FIG. 1. According to yet another embodiment, the non-linear element is a diode-connected bipolar transistor.

Figure 2:
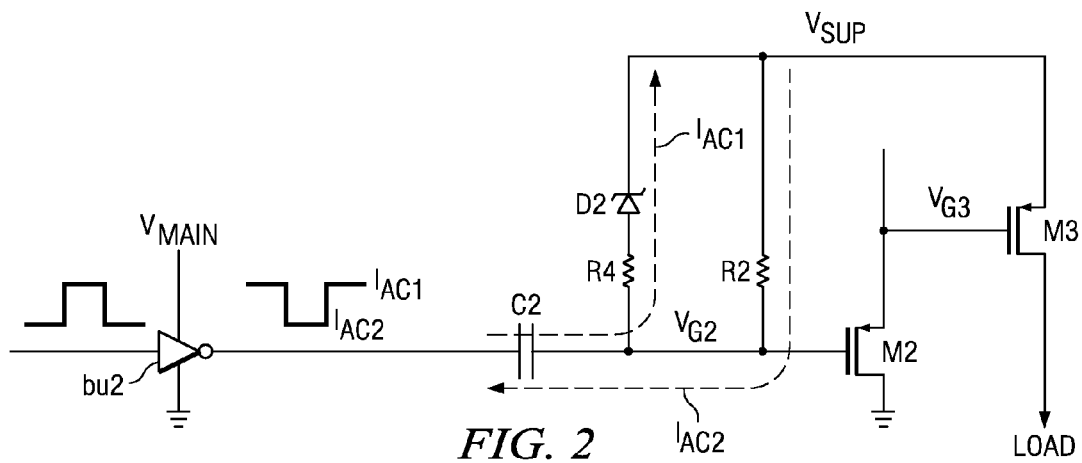
FIG. 2 is a partial circuit diagram illustrating an asymmetrical level-shifting.
Figure 3:
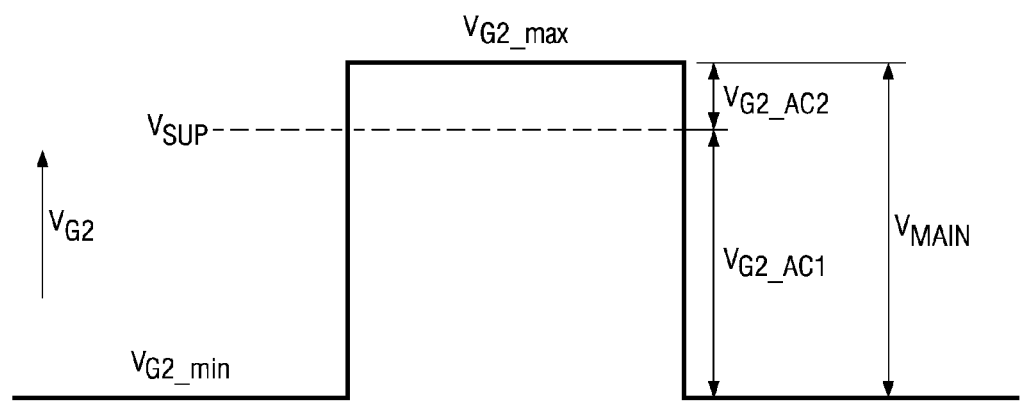
FIG. 3 is a signal diagram illustrating a level-shifted drive signal.

With reference to FIGS. 2 and 3, the diode D2 and resistor R4 behave like a non-linear resistor to reduce the minimum voltage level $V_{G2\_min}$ of the drive voltage $V_{G2}$ at the gate of transistor M2. The maximum voltage level $V_{G2\_max}$ at the gate of transistor M2 is only slightly above the level of the supply voltage $V_{sup}$ Since no DC current can flow through capacitor C2, the current $I_{AC1}$ from a rising edge is equal to the current $I_{AC2}$ from a falling edge, $I_{AC1}=I_{AC2}$. With R4<<R2:

$$V_{G2\_AC1} < V_{G2\_AC1}.$$

$V_{G2}$ for the two states of the drive signal is calculated as follows:

$$V_{G2\_AC2} = V_{SUP} - I_{AC2} * R2;$$

$$V_{G2\_AC1} = V_{SUP} + (I_{AC1} * R4 + V_{D2}).$$

wherein $V_{D2}$ is the voltage drop across diode D2.

As is illustrated in FIG. 3, the asymmetrical level-shift is due to R4<<R2 in combination with the non-linear component such as the diode D1 in FIG. 1. The voltage excursion of $V_{G2}$ is still the same as $V_{MAIN}$, but the mean level is shifted towards lower values with respect to $V_{SUP}$.

It should be clear that a similar effect occurs with respect to the gate voltage $V_{G1}$ at transistor M1 due to the behavior of D1 and R2 as a non-linear resistor in the bias circuit for transistor M1.

By selecting the ratio between the resistors in the bias circuits of transistors M1 and M2, the gate voltage level for the power transistor can be adjusted. As a result, in spite of a low circuit complexity, the gate of power PMOS transistor M3 is driven at the maximum possible gate-source voltage which is defined by the level of $V_{MAIN}$ (in practice reduced by charge losses and by the threshold of M2) so as to obtain the minimum ON resistance (the drain-source resistance) and, therefore, ensure maximum efficiency of the DC-DC converter of which M3 is a component. In addition, the capacitive coupling ensures fast switching of the driver transistors.

Those skilled in the art to which the invention relates will appreciate that there are other ways and variations of ways to implement the principles of the claimed invention.

What is claimed is:

1. A power switching circuit in CMOS technology, the circuit comprising:
   a first voltage rail;
   a second voltage rail
   a power MOS transistor that coupled to the first voltage rail;
   a pair of driver MOS transistors coupled in series with one another between the first and second voltage rails, wherein the gate of the power MOS transistor is coupled to a node between the driver MOS transistors;
   a pair of buffers that are each coupled to the gate of one of the driver MOS transistors and that each receive a clock signal;
   a pair of first resistors that are each coupled between the first voltage rail and the gate of one of the driver MOS transistors; and
   a pair of impedance branches that are each coupled between the first voltage rail and the gate of one of the driver MOS transistors, wherein each impedance branch includes a second resistor coupled in series with a non-linear component, and wherein the resistance value of each second resistor is substantially smaller than the resistance value of its corresponding first resistor.

2. The circuit of claim 1, wherein the circuit further comprises a pair of capacitors that are each coupled between one of the buffers and the gate of its corresponding driver MOS transistor.

3. The circuit of claim 2, wherein the non-linear component is a diode, a diode-connected MOS transistor, or a diode-connected bipolar transistor.

4. The circuit of claim 1, wherein the circuit further comprises a biasing resistor coupled between the first voltage rail and the gate of the power MOS transistor.

5. The circuit of claim 4, wherein the non-linear component is a diode, a diode-connected MOS transistor, or a diode-connected bipolar transistor.

6. An apparatus comprising:
   a first voltage rail;
   a second voltage rail;
   a power transistor that coupled to the first voltage rail;
   a pair of driver transistors coupled in series with one another between the first and second voltage rails, wherein the control electrode of the power transistor is coupled to a node between the driver transistors;
   a pair of first resistors that are each coupled between the first voltage rail and the control electrode of one of the driver transistors;
   a pair of impedance branches that are each coupled between the first voltage rail and the control electrode of one of the driver transistors, wherein each impedance branch includes a second resistor coupled in series with a non-linear component, and wherein the resistance value of each second resistor is substantially smaller than the resistance value of its corresponding first resistor; and
   a biasing resistor that is coupled between the first voltage rail and the control electrode of the power transistor.

7. The circuit of claim 6, wherein the apparatus comprises:
   a pair of buffers that are each coupled to the control electrode of one of the driver transistors and that each receive a clock signal;
   a pair of capacitors that are each coupled between one of the buffers and the control electrode of its corresponding driver transistor.

8. The apparatus of claim 6, wherein the non-linear component is a diode, a diode-connected MOS transistor, or a diode-connected bipolar transistor.

9. An apparatus comprising:
   a first voltage rail;
   a second voltage rail;
   a first buffer that receives a clock signal;
   a second buffer that receives the clock signal;
   a first capacitor that is coupled to the first buffer;

a second capacitor that is coupled to the second buffer;

a first PMOS transistor that is coupled to the first capacitor at its gate and the first voltage rail at its source;

a second PMOS transistor that is coupled to the second capacitor at its gate, the second voltage rail at drain, and the drain of the first PMOS transistor at its source;

a first resistor that is coupled between the first voltage rail and the gate of the first PMOS transistor;

a second resistor that is coupled between the first voltage rail and the gate of the second PMOS transistor;

a first non-linear component that is coupled to the voltage rail;

a second non-linear component that is coupled to the voltage rail;

a third resistor that is coupled between the first non-linear device and the gate of the first PMOS transistor;

a fourth resistor that is coupled between the second non-linear device and the gate of the second PMOS transistor;

a third PMOS transistor that is coupled to the first voltage rail at its source and that is coupled to the drain of the first PMOS transistor at its gate; and a fifth resistor that is coupled between the first voltage rail and the gate of the third PMOS transistor.

10. The apparatus of claim 9, wherein each of the first and second non-linear components is a diode, a diode-connected MOS transistor, or a diode-connected bipolar transistor.

* * * * *